(12) United States Patent
Suzuki et al.

(10) Patent No.: US 7,718,590 B2
(45) Date of Patent: May 18, 2010

(54) METHOD TO REMOVE RESIST, ETCH RESIDUE, AND COPPER OXIDE FROM SUBSTRATES HAVING COPPER AND LOW-K DIELECTRIC MATERIAL

(75) Inventors: Tomoko Suzuki, Tokyo (JP); Toshitaka Hiraga, Kanagawa (JP); Yasuo Katsuya, Kawasaki (JP); Chris Reid, Glasgow (GB)

(73) Assignee: EKC Technology, Inc. CA (US)

( * ) Notice: Subject to any disclaimer, the term of this patent is extended or adjusted under 35 U.S.C. 154(b) by 1043 days.

(21) Appl. No.: 11/360,810

(22) Filed: Feb. 24, 2006

(65) Prior Publication Data

US 2006/0199749 A1 Sep. 7, 2006

Related U.S. Application Data

(60) Provisional application No. 60/656,169, filed on Feb. 25, 2005.

(51) Int. Cl.
*C11D 7/50* (2006.01)

(52) U.S. Cl. .......... 510/175; 510/176; 134/1.3

(58) Field of Classification Search ........ 510/175, 510/176; 134/1.3
See application file for complete search history.

(56) References Cited

U.S. PATENT DOCUMENTS

| | | | |
|---|---|---|---|
| 5,792,274 A | 8/1998 | Tanabe et al. | |
| 5,939,336 A | 8/1999 | Yates | |
| 5,972,862 A | 10/1999 | Torii et al. | |
| 6,235,693 B1 | 5/2001 | Cheng et al. | |
| 6,468,951 B1 | 10/2002 | Grieger et al. | |
| 6,638,899 B1 | 10/2003 | Wakiya et al. | |
| 6,773,873 B2 * | 8/2004 | Seijo et al. | 430/329 |
| 2004/0029753 A1 * | 2/2004 | Ikemoto et al. | 510/175 |
| 2004/0038840 A1 | 2/2004 | Lee et al. | |
| 2004/0106531 A1 | 6/2004 | Kanno et al. | |
| 2005/0287480 A1 * | 12/2005 | Takashima | 430/331 |
| 2006/0014656 A1 * | 1/2006 | Egbe et al. | 510/175 |
| 2007/0066502 A1 * | 3/2007 | Brainard et al. | 510/175 |

FOREIGN PATENT DOCUMENTS

| | | |
|---|---|---|
| EP | 1347339 | 9/2003 |
| EP | 1612611 | 1/2006 |
| JP | 325551 | 11/1991 |
| JP | 2000015200 | 1/2000 |
| JP | 2003122028 | 4/2003 |

* cited by examiner

*Primary Examiner*—Gregory E Webb
(74) *Attorney, Agent, or Firm*—Dunlap Codding, P.C.

(57) ABSTRACT

A variety of compositions that are particularly applicable for removing one or more of resist, etching residue, planarization residue, and copper oxide from a substrate comprising copper and a low-k dielectric material are described. The resist, residues, and copper oxide are removed by contacting the substrate surface with the composition, typically for a period of 30 seconds to 30 minutes, and at a temperature between 25° and 45° C. The composition includes a fluoride-providing component; at least 1% by weight of a water miscible organic solvent; an organic acid; and at least 81% by weight water. Typically the composition further includes up to about 0.4% of one or more chelators.

11 Claims, No Drawings

METHOD TO REMOVE RESIST, ETCH RESIDUE, AND COPPER OXIDE FROM SUBSTRATES HAVING COPPER AND LOW-K DIELECTRIC MATERIAL

RELATED APPLICATIONS

This application claims benefit of U.S. provisional patent application 60/656,169 filed Feb. 25, 2005.

STATEMENT REGARDING FEDERALLY SPONSORED RESEARCH OR DEVELOPMENT

Not Applicable.

FIELD OF THE INVENTION

The present invention generally relates to compositions and methods for cleaning integrated circuit substrates. The invention more particularly relates to compositions and methods for removal of photoresist, post etch residue, and/or post planarization residue from substrates comprising copper, where the compositions comprise a fluoride species.

BACKGROUND OF THE INVENTION

Devices with critical dimensions on the order of 90 nanometers have involved integration of copper conductors and low-k dielectrics. Devices with critical dimensions on the order of 90 nanometers require alternating material deposition processes and planarization processes. Following almost each step in the fabrication process, e.g., a planarization step, a trenching step, or an etching step, cleaning processes are required to remove residues of the plasma etch, oxidizer, abrasive, metal or other liquids or particles remaining which contaminate the surface of the wafer. Prior art devices were fabricated from aluminum and/or tungsten conductors with silica dielectrics. Fabrication of the current advanced generation of devices require copper conductors and low-k dielectric materials (typically carbon-silica or porous silica materials), both of which can react with and be damaged by various classes of prior art cleaners.

Low-k dielectrics in particular may be damaged in the cleaning process as evidenced by etching, changes in porosity/size, and ultimately changes in dielectric properties. Time required to remove residues depends on the nature of the residue, the process (heating, crosslinking, etching, baking, and/or ashing) by which it is created, and whether batch or single wafer cleaning processes are used. Some residues may be cleaned in a very short period of time, while some residues require much longer cleaning processes. Compatibility with both the low-k dielectric and with the conductor over the duration of contact with the cleaner is a desired characteristic.

Cleaning processes fall into two broad process classes: batch and single wafer. Batch cleaning typically involves multiple wafers, and the cleaning process occurs on the order of minutes, usually by contacting the wafers with an agitated cleaning solution at a temperature between about 20° C. and about 100° C., typically between 30° C. and 75° C., for a period of time ranging from 3 minutes to about 60 minutes, typically between 10 to 30 minutes. In a batch mode, the plurality of wafers are typically immersed in the cleaning solution or exposed to a constant spray of cleaning solution. The single wafer cleaning process involves cleaning under more rigid conditions of agitation and contact, at temperatures similar to or up to about 20° C. higher than comparable immersion process temperatures, but for a period of time that ranges from about 5 seconds but less than 3 minutes, and typically between 30 to 90 seconds, as the composition is dispensed onto a spinning wafer.

Semi-aqueous cleaners comprising a fluorine-containing component, solvent, and water are known.

1) Japanese patent laying open no. 2003-122028, to Kenji et al., describes a composition comprising 0.5% to 10% of a fluorine compound, greater than 30% of a mixed amide/ether solvent and water, and teaches that at solvent concentrations less than 30% corrosion of the wiring material becomes intense.

2) Japanese patent laying open no. 2001-5200, to Yoko et al., describes a resist removing composition for substrates comprising aluminum wiring, the composition comprising 0.1% to 2% ammonium fluoride, 20% to 98.8% of a polar organic solvent, 0.05% to 1.9% ascorbic acid, and 1% to 79.8% water, with pH less than 5.0. The listed polar organic solvents are N,N-dimethylformamide, N,N-dimethylacetamide, dimethyl sulfoxide, ethylene glycol, and propylene glycol.

3) U.S. Pat. No.5,792,274, to Tanabe et al., describes a remover solution composition for resist which comprises (a) 0.2% to 8% a salt of hydrofluoric acid with a metal-free base, (b) 30% to 90% of a water-soluble organic solvent such as a glycol ether, and (c) water and optionally (d) an anticorrosive, at a pH of 5 to 8.

4) U.S. Pat. No.5,939,336 describes residue remover compositions of ammonium fluoride, propylene glycol, ammonia and water, at a pH of from 7 to 8.

5) U.S. Pat. No.5,972,862 describes a post-etch residue remover having: (A) 0.1% to 15% of a fluoride-containing compound such as hydrofluoric acid or ammonium fluoride; (B) 1% to 80% of a polar organic solvent selected from a list including amides, lactones, alcohols, alkyl acetates, alkyl lactates, alkylene glycols, glycol ethers, and sulfoxides; (C) 0.01% to 5% of an phosphoric acid, phosphorous acid, hypophosphorous acid, polyphosphoric acid, or an organic acid; and (D) 1% to 50% of a quaternary ammonium salt. Water is not a specified component of the remover, and while there is no range specified for water, one example was described as containing 45.9% water. Examples have 1-10% NH4F, 0.1-1% organic acid, and 35-69% amide solvent, and presumably a balance (~30% to ~60%) water.

6) U.S. Pat. No.5,792,274 describes a resist/residue remover having 0.2% to 8% of a salt of metal-free base and HF, 30% to 90% of a water-soluble organic solvent, and water where the pH is 5-8. The preferred solvent is ethylene glycol or ethylene glycol and dimethylsulfoxide.

7) U.S. Pat. No.6,235,693 describes residues removers comprising 0.01% to 10% of fluoride compounds, 20% to 50% water, 20% to 80% of a piperidone and from 0 to 50% of an organic sulfoxide or glycol solvent, said composition having a pH between about 6 and about 10.

8) U.S. Pat. No.6,468,951 describes a composition to remove silica residue from a borophosphosilicate semiconductor wafer, said composition having a basic or an acidic pH, and being comprised of: water; 0.01% to 95% of a hydroxyl-functional solvent such as ethylene glycol or an alcohol; aqueous hydrofluoric acid; a tetraalkyylammonium hydroxide; and about 0.001 wt % to about 10 wt % of a surfactant. The patent does not mention use of the composition with copper-containing substrates.

9) U.S. Pat. No.6,638,899 describes a photoresist remover comprising hydrofluoric acid, a base free from metal ions, 30% to 80% of a water-soluble organic, water, and an alkali, wherein the pH of the remover is 8.5 to 10.

10) JP 3255551 describes a composition having 0.5-40% HF, 40-99.5% water, water-soluble organic solvent, and 0.5-40% anticorrosion agent, useful for removing resist in short time at low temperatures.

11) Finally, U.S. published Application No. 2004/0106531, the disclosure of which is incorporated herein by reference thereto specifically for the semiconductor fabrication processes which form various types residue, each type of which can be removed with compositions of the present invention. This application discloses removers useful for copper/low-k material substrates, the removers comprising a metal-free salt of hydrogen fluoride; 50% to 98% of a water-soluble organic solvent; an acid; and water.

With the continuing reduction in device critical dimensions and continuing needs for production efficiency and device performance, there is a need for fluorine-containing cleaning compositions with low solvent content which are effective in both batch and single wafer processes.

SUMMARY OF THE INVENTION

The invention relates to both batch processing and single wafer processing methods for removing one or more of photoresist, etching residue, or planarization residue, and also copper oxide, from a substrate, wherein the method comprises contacting the substrate with a composition described herein, under temperature and time constraints described herein (which differ for batch processes versus single wafer processes), wherein agitation is the agitation/turbulence is that normally encountered in batch process or single wafer process, respectively. The substrate comprises a copper-containing metal conductor and a dielectric material, in particular a low-k dielectric material. The compositions comprise a fluorine-containing (fluoride-providing) component, between 1 to less than 20% by weight of a water miscible solvent, an acid, and at least 80% by weight water.

The use of a high-water-content, such as 80% or better, or alternatively 81% or better, is not common for formulations used to remove resist residue from substrates having copper wiring thereon. Historically, residue formulations contained 50% or less of water, and high water concentrations were avoided because the damage to the substrate, which comprises copper, a low-k dielectric material, and typically barrier materials, would result. The use of high water content formulations is desirable, because such formulations have a lower cost and a lower environmental impact than do high-solvent-content (e.g., typically greater than 30% solvent, more often more than 50% solvent) residue removers.

In a first embodiment the invention comprises a method for removing one or more of resist, etching residue, planarization residue, and copper oxide from a substrate comprising copper and a low-k dielectric material, said method comprising the steps of:

A) providing a substrate comprising copper-containing conductor and a low-k dielectric material; and
   B) contacting the substrate with a composition comprising:
   a) a fluoride-providing component;
   b) at least 1% by weight of a water miscible organic solvent;
   c) an acid; and
   d) at least 81% by weight water, for a time and at a temperature sufficient to remove the resist, residues, and/or copper oxide. Advantageously in an alternative embodiment the fluoride-providing component is present in an amount between about 0.01% to about 0.6% as fluorine; the water miscible organic solvent is present in an amount between about 1.5% to 19%; and the pH is between about 1.3 and about 7, for example between 1.3 and 4.5 or between 4.5 and 7. Advantageously in an alternative embodiment the water miscible organic solvent comprises a glycol ether present in an amount between about 2.5% to about 10%, the pH is between about 1.9 to about 3.8, and wherein the temperature is between about 20° C. to about 70° C. Alternatively in another embodiment the water miscible organic solvent comprises a glycol ether present in an amount between about 2.5% to about 10%, the pH is between about 4.5 to about 6, for example between about 4.8 to about 5.9, and wherein the temperature is between about 20° C. to about 70° C. Generally, more rigorous matching of ingredients is necessary when the pH is between about 4.5 to about 6, and ingredients are not interchangable: At pH 4.5 to 6, the solvent propylene glycol monomethyl ether (PGME) is preferred over other glycol ethers, dimethylaminoethanol is preferred over other alkanolamines when the chelator HEDP, but 2-diethylaminoethanol is preferred over other alkanolamines when the composition includes the chelator diethylenetriamine pentaacetic acid (DTPA). Advantageously in an alternative embodiment the water miscible organic solvent comprises propylene glycol monoethyl ether, propylene glycol monomethyl ether, diethylene glycol monomethyl ether, diethylene glycol monobutyl ether, or mixture thereof. Advantageously the acid consists essentially of one or more carboxylic acids, and the composition is substantially free of mineral acids (other than traces of mineral acids present in chelator formulations). Alternately, the acid comprises an hydroxy substituted carboxylic acid. Alternately, the acid comprises a carbonyl substituted carboxylic acid. Advantageously the acid comprises one or more mono- or di-carboxylic acids having between 2 and 6 carbon atoms which are substituted in an alpha position or in a beta position with an hydroxy group or a carbonyl group. In a preferred embodiment the acid comprises glyoxylic acid, oxalic acid, or an amino substituted carboxylic acid. At high pH values, e.g., between about 4.5 and about 6, however, citric acid (or more appropriately a metal-free salt of citric acid) is preferred. As used herein, the recital of an organic acid includes the salts of that acid as necessary to exist in an aqueous environment at the recited pH.

In a second embodiment the invention comprises a method for removing one or more of resist, etching residue, planarization residue, and copper oxide from a substrate comprising copper and a low-k dielectric material, said method comprising the steps of:

A) providing a substrate comprising a copper-containing conductor and a low-k dielectric material; and
   B) contacting the substrate with a composition comprising:
   a) a fluoride-providing component;
   b) at least 1.5% by weight of a water miscible glycol ether;
   c) an acid; and
   d) at least about 80% by weight water, wherein the composition is at a temperature between 20° C. and about 100° C., for a time sufficient to remove the resist, residues, and/or copper oxide. Advantageously the pH is between about 1.3 and about 7, for example between about 1.3 and 4.5 or between 4.5 and 7. Advantageously the fluoride-providing component is present in an amount between about 0.015% to about 0.1% as fluorine; the water miscible organic solvent is present in an amount between about 2% to about 15%; the water is present in an amount between about 85% to about 98%, or alternatively from about 88% to about 97%; wherein the pH is between about 2 and about 3.3. Advantageously the composition further comprises from about 0.001% to about 10% of a chelator, wherein said chelator is selected from diethylenetriamine pentaacetic acid or its salts, ethylenediamine tetraacetic acid or its salts, or mixtures thereof. Advantageously the acid comprises an amino acid, for example glycine, hydroxyethyl glycine, cysteine, alanine, or mixture thereof. Advantageously in an alternative embodiment the acid comprises boric acid, phosphorous acid, phosphonic acid, or mixture thereof, wherein the composition further comprises from about 0.01% to about 5% of a chelator, and said chelator is an organophosphonate compound having at least two phosphonate groups. Advantageously in an alternative embodiment the composition further comprises from about 0.05% to about 1% of a chelator, wherein said chelator is an organo-phosphonate having at least two phosphonate groups, diethylenetriamine pentaacetic acid or its salts, ethylenediamine tetraacetic acid or its salts, or mixtures thereof. Advantageously the composition comprises from about 0.01% to about 5% of hydroxyethylidene 1,1-diphosphonic acid. Advantageously in an alternative embodiment the acid comprises phosphoric acid, phosphorus acid, or both, and further comprises one or more organic acids, wherein the weight % of organic acids is greater than the weight % of phosphonic acid, phosphorus acid, or both. Advantageously the temperature is between about 20° C. to about 70° C.

In a third embodiment the invention comprises a method for removing one or more of resist, etching residue, planarization residue, and copper oxide from a substrate comprising copper and a dielectric material, said method comprising the steps of:
A) providing a substrate comprising a copper-containing conductor and a dielectric material; and
B) contacting the substrate with a composition comprising:
a) a fluoride-providing component;
b) at least 1.5 by weight of a water miscible organic solvent comprising a glycol ether, a glycol ether acetate, or mixture thereof;
c) an acid; and
d) at least about 80% by weight water, wherein the pH of the composition is between about 1.3 and 4.5, for a time and at a temperature sufficient to remove the resist, residues, and/or copper oxide. Advantageously the water miscible organic solvent is present in an amount between about 2.5% to about 19%, wherein the time is between 10 seconds and 60 minutes, and the temperature is between about 20° C. to about 70° C. Advantageously the water is present in an amount between about 88% to about 97%. Advantageously the pH is maintained between 2.4 to 2.7, the glycol ether concentration is between about 5% to about 15%, and the acid is present in an amount between about 0.5% and about 1.5%.

In a fourth embodiment the invention comprises a method for removing one or more of resist, etching residue, planarization residue, and copper oxide from a substrate comprising copper and a low-k dielectric material, said method comprising the steps of:
A) providing a substrate comprising a copper-containing conductor and a low-k dielectric material; and
B) contacting the substrate with a composition consisting essentially of:
a) a fluoride-providing component;
b) at least 1.5% by weight of a water miscible glycol ether, amide, sulfoxide, or mixture thereof;
c) an acid;
d) at least about 80% by weight water; and
e) optionally a chelator, for a time and at a temperature sufficient to remove the resist, residues, and/or copper oxide.

In a fifth embodiment the invention comprises a method for removing one or more of resist, etching residue, planarization residue, and copper oxide from a substrate comprising copper and a low-k dielectric material, said method comprising the steps of:
A) providing a substrate comprising a copper-containing conductor and a low-k dielectric material; and
B) contacting the substrate with a composition comprising:
a) a fluoride-providing component, for example HF, ammonium fluoride, and/or ammonium bifluoride, that provides between about 0.005% and about 0.18%, for example between 0.01% and 0.05%, by weight as fluoride;
b) between about 1% to less than 20%, for example between 1.5% and 12%, by weight of a water miscible organic solvent, preferably a glycol ether, for example PGME;
c) between about 0.05% to about 5%, for example between 0.2% and 1.5%, by weight of an acid comprising one or more carboxylate moieties, for example a monocarboxylic acid having a carbonyl and/or hydroxyl group substituted in on a carbon adjacent to, or one carbon removed from, the carboxylate carbon;
d) between 80% and about 98.9%, for example between 88% and 97%, by weight water; and
e) optionally between about 0.001% to about 0.5%, for example between 0.01% and 0.2%, by weight of a chelator, for example EDTA, HEDP, ATMP, DTPA, and/or ammonium salts thereof, and/or combinations thereof, wherein the composition is at a temperature between about 10° C. and 60° C., for example between about 15° C. and about 45° C., for a time sufficient to remove the resist, residues, and/or copper oxide, for example between about 10 seconds and about 30 minutes, for example between about 30 seconds and about 10 minutes. The pH, in a preferred embodiment, is between about 1.8 and about 3.6, more typically between about 1.9 and 2.8. Advantageously this composition, and also every residue remover composition described herein, is substantially free of metal ions, including halogen ions and also transition metal ions, where substantially free means less than about 50 ppm, preferably less than about 10 ppm, and typically less than about 5 ppm. It is known that if fluoride-providing components other than HF, ammonium fluoride, and/or ammonium bifluoride is used, for example a fluoroborate and/or a fluorosilicate, then these components will provide less fluoride per unit weight of fluoride-providing compound, so in an alternative embodiment the fluoride-providing component is present in an amount between about 0.02% to about 0.15% by weight as fluoride. The water miscible organic solvent is, in a preferred embodiment, present in an amount between about 2% to about 11% by weight, and advantageously comprises at least one glycol ether. The water is, in a preferred embodiment, present in an amount between about 88% to about 97%; and the pH is between about 1.9 and about 2.9. Advantageously the acid comprises an amino acid or glyoxylic acid. Acetic acid can be used, as it is less costly than other low molecular weight organic acids. Advantageously, in an alternative embodiment, the acid further comprises boric acid, phosphorous acid or phosphonic acid, or mixture thereof, generally in an amount between about 0.001% to about 0.5%. Advantageously, for most applications a chelator is included—the chelator is in a preferred embodiment a compound having at least two phosphonate groups, diethylenetriamine pentaacetic acid or its salts, ethylenediamine tetraacetic acid or its salts, or mixtures thereof.

In another important embodiment a semiconductor wafer containing copper is cleaned with a formulation containing: a) about 0.01% to about 0.06%, typically about 0.02% to about 0.05%, of ammonium fluoride; b) about 1% to 20%, typically about 5% to about 10%, of propylene glycol monomethyl ether; c) about 2% to 10%, typically about 2.7% to about 10%, or alternatively between about 2% and 4%, of a carboxylic acid or ammonium salt thereof or combination thereof; d) optionally about 0.01% to 0.2%, typically about 0.02% to about 0.1%, of a chelator compound containing phosphonate groups (e.g., HEDP) or DPTA or mixture thereof; e) optionally between 0.5% to about 10%, typically about 1% to about 5%, of an amine selected from dimethylaminoethanol, 2-diethylaminoethanol, or mixture thereof; and f) at least about 80% water, typically at least about 85% water; having a pH between about 4.5 and 7, typically between about 4.7 and about 6. The ethanolamine compound is typically required if an acid is used as opposed to a salt of an acid. Such a formulation has been shown to be useful in removing all residue while minimizing copper corrosion and still providing an acceptable copper oxide removal time (e.g., below 30 seconds). While organophosphonate chelators have excellent performance, in some embodiments carboxylate-based chelators (including DPTA, EDTA, and the like) are preferred to eliminate phosphorus from the composition.

The compositions may be included as one premixed composition. The advantage of these compositions is they have 48 to more than 72 hour a pot life, meaning the composition, cleaning/removing ability, and degree off alteration/attack of various substrate sections (including particularly the copper and the dielectric sections), is within narrow prescribed limits. In an alternate embodiment, the composition can be formed by admixing two or more fluid streams, for example a first stream comprising an aqueous mixture of the active ingredients and a second stream consisting of deionized water. Its generally highly advantageous to ship concentrates as opposed to residue remover compositions formulated at point of use strength. This is yet another advantage of a high-water-content formulation.

DETAILED DESCRIPTION

It is recognized that various components of the compositions of this invention interact, and therefore any composition is expressed as the amount of various components which, when added together, form the composition. Unless specifically stated, any composition given in percent is percent by weight of that component that has been added to the composition. When the composition is described as being substantially free of a particular component, generally there are numeric ranges provided to guide on of ordinary skill in the art to what is meant by "substantially free," but in all cases "substantially free" encompasses the preferred embodiment where the composition is totally free of that particular component.

We present in a first embodiment a composition which is useful in the methods for removing one or more of photoresist, etching or planarization residue, and copper hydroxide from a substrate, said composition comprising, or alternatively consisting essentially of:

(a) a fluorine-containing, fluoride-providing component, for example present in an amount between about 0.002% to about 3.0% as fluorine, typically from about 0.01% to about 0.6% as fluorine, or alternatively between about 0.015% to about 0.1% as fluorine;

(b) at least 1%, preferably at least 1.5%, for example between 1% to less than 20%, alternately from about 1.5% to 19%, typically from about 2% to about 15% or from about 2.5% to about 10%, of a water miscible solvent;

(c) an acid, preferably an organic acid; and (d) at least 80%, preferably at least 81%, for example between 81% to about 98.9%, typically between about 85% to about 98%, or alternatively from about 88% to about 97%, water. Advantageously the pH of the composition is less than 7, for example between about 1.5 and 4, typically between about 2 and 3.3. In alternative embodiments, the pH can range from 4 to 6.5, preferably from 4.5 to 6, for example from 5 to 5.9.

We present in another embodiment a composition which is useful for removing one or more of photoresist, etching or planarization residue from a substrate, said composition comprising, or alternatively consisting essentially of:

(a) a fluorine-containing component;

(b) between 1% to less than 20% of a water miscible solvent;

(c) an acid; and (d) at least 80% water; and (e) optionally a chelating agent.

The fluorine-containing component must provide fluoride ions, and may be selected from the group consisting of fluoride-containing acids and/or metal-free salts thereof. The term "metal-free salt of fluoride-containing acid" as used herein means metals are not contained in the salt anion or cation. The salt may be formed by combining a fluoride-containing acid such as hydrogen fluoride, tetrafluoroboric acid, and/or trifluoroacetic acid, with any of ammonium hydroxide; a $C_1$-$C_4$ alkyl quaternary ammonium ions such as tetramethylammonium, tetraethylammonium and trimethyl (2-hydroxyethyl)ammonium; or a primary, secondary or tertiary amines such as monoethanolamine, 2-(2-aminoethylamino)ethanol, diethanolamine, 2-ethylaminoethanol and dimethylaminoethanol.

Exemplary fluorine-containing components include hydrogen fluoride and/or its salts ammonium fluoride and/or ammonium bifluoride (ammonium hydrogen difluoride); fluoroboric or tetrafluoroboric acid and/or its salts such as ammonium tetrafluoroborate; fluoroacetic or trifluoroacetic acid and/or its salts such as ammonium trifluoroacetate; fluorosilicic acid and/or its salts, and any mixtures thereof. As used herein, fluorine and fluoride are used interchangeably. Preferred fluorine-containing components include hydrogen fluoride, ammonium fluoride, ammonium bifluoride, alkylammonium fluoride, alkylammonium bifluoride, and mixtures thereof, where the alkylammonium fluoride and/or bifluoride comprises 1 to 8 carbon atoms, preferably from 1-4 carbon atoms, and is a mono-, di-, tri-, or tetra-alkylammonium group. More preferably, the fluoride-containing compound consists essentially of ammonium fluoride, ammonium bifluoride, or both, most preferably ammonium fluoride.

Ammonium salts of hydrogen fluoride are preferred. In one embodiment, the dilute solution according to the invention can be substantially free of tetrafluoroboric acid and/or its salts, of trifluoroacetic acid or its salts, or both.

The fluorine-containing component is advantageously present at from about 0.002% to about 3.0% as fluorine, preferably from about 0.01% to about 0.6% as fluorine, for example between about 0.015% to about 0.1% as fluorine. The examples in Table 5, comprising from about 0.02% to about 0.06% as fluorine, all exhibited excellent results.

In an alternate embodiment, the fluorine-containing component is present at from about 0.001 equivalents of fluoride per liter to about 0.3 equivalents per liter, for example between about 0.005 and about 0.1 equivalents of fluoride per liter. The examples showed excellent results were obtained with the fluorine-containing component present at from about 0.01 to about 0.04 equivalents of fluoride per liter.

The water miscible solvent advantageously comprises, or alternatively consists essentially of, one or more alkyl glycol ethers, hereafter "glycol ethers." Glycol ethers are well known and include but are not limited to mono- or dialkyl ethers of polyols such as alkyl ethers of ethylene glycol. Exemplary glycol ether species useful in the compositions include but are not limited to ethylene glycol monomethyl ether (EGME), ethylene glycol monoethyl ether (EGEE), ethylene glycol monopropyl ether (EGPE), ethylene glycol monobutyl ether (EGBE), propylene glycol monomethyl ether (PGME), propylene glycol monoethyl ether (PGEE), propylene glycol monopropyl ether (PGPE), propylene glycol monobutyl ether (PGBE), diethylene glycol monomethyl ether (DGME), diethylene glycol monoethyl ether (DGEE), diethylene glycol monopropyl ether (DGPE), diethylene glycol monobutyl ether (DGBE), dipropylene glycol monomethyl ether (DPGME), dipropylene glycol monoethyl ether (DPGEE), dipropylene glycol monopropyl ether (DPGPE), dipropylene glycol monobutyl ether (DPGBE), triethylene glycol monomethyl ether, triethylene glycol monoethyl ether, triethylene glycol monopropyl ether, triethylene glycol monobutyl ether, tripropylene glycol monomethyl ether, tripropylene glycol monoethyl ether, tripropylene glycol monopropyl ether, tripropylene glycol monobutyl ether, and mixtures thereof.

Optionally, in another embodiment, the solvent can comprise or consist essentially of glycol ether acetates, e.g., ethylene glycol monomethyl ether acetate, ethylene glycol monoethyl ether acetate, and the like.

Preferred glycol ethers include propylene glycol monoethyl ether (PGEE), propylene glycol monomethyl ether (PGME), diethylene glycol monomethyl ether (DGME), and diethylene glycol monobutyl ether (DGBE). More preferred glycol ethers are PGEE, DGME, and PGME. Most preferred is PGME.

While glycol ethers are the preferred solvents, and embodiments of this invention (including most examples) have substantially no solvents other than glycol ethers, other embodiments of this invention allow use of other water miscible solvents. However, compositions in this class advantageously comprise water miscible solvents other than glycol ethers combined with at least one glycol ether. Other solvents include but are not limited to sulfoxides such as dimethylsulfoxide, diethylsulfoxide, or methylsulfoxide; sulfones such as dimethyl sulfone, diethyl sulfone, bis(2-hydroxyethyl) sulfone, or tetramethylene sulfone; amides such as N,N-dimethylformamide, N-methylformamide, N,N-dimethylacetamide, N-methylacetamide, or N,N-diethylacetamide; lactams such as N-methyl-2-pyrrolidone, N-ethyl-2-pyrrolidone, N-propyl-2-pyrrolidone, N-hydroxymethyl-2-pyrrolidone, N-hydroxyethyl-2-pyrrolidone, or N-methylpyrrolidinone; imidazolidinones such as 1,3-dimethyl-2-imidazolidinone, 1,3-diethyl-2-imidazolidinone, or 1,3-diisopropyl-2-imidazolidinone; lactones such as gamma.-butyrolactone or delta-valerolactone; and glycols such as ethylene glycol, diethylene glycol, or propylene glycol.

Sulfoxides and/or amides are generally selected if a second co-solvent is desired. The preferred type of co-solvent, amide versus sulfoxide, can be determined by the types of resists to be encountered, as is taught in published U.S. Application No. 2004/0106531. Generally, in preferred variants, the weight percent of glycol ethers in the compositions are greater than the weight percent of solvents other than glycol ethers.

In other embodiments of this invention, the compositions are substantially free of solvents other than glycol ethers. These embodiments are not preferred. Generally, substantially free means the composition comprises less than 1%, preferably less than 0.5%, and more preferably less than about 0.1%, most preferably free of solvents other than glycol ethers. In an alternate embodiment, compositions are substantially free of sulfones, imidazolidinones, and lactones. In another embodiment, compositions are substantially free of glycols. Finally, in yet another alternative embodiment of the invention, compositions are substantially free of sulfones, imidazolidinones, lactones, and glycols.

As used herein, the term "polar organic solvent" is not meant to encompass ammonium hydroxide or alkyl-substituted ammoniun hydroxides. As used herein, the term "polar organic solvent" preferably also does not encompass alkanolamines.

The water miscible solvent is present at from about 1% to less than about 20%, typically from about 5% to 19%, for example from about 2% to about 15%. The examples in Table 5 showed excellent results were obtained with the water miscible solvent present at from about 2.5% to about 10%.

In one embodiment, the acid comprises, or alternatively consists essentially of, organic acids, or alternatively mixtures of mineral acids and organic acids. The term "acid" as used herein specifically refers to acids other than those acids which provide fluoride. The use of mineral acids is less preferred, and is generally limited to use of boric acid, phosphoric acid, phosphorous acid, or phosphonic acid, more preferably phosphonic acid and/or phosphorus acid. Preferably, if mineral acids are present, they form only a minor part (less than half by weight) of the total weight of acid, with the majority of the acid comprising one or more organic acids. A preferred class of compositions of the present invention are substantially free of mineral acids. By substantially free of mineral acids, we mean less than 0.05%, preferably less than 0.01%, of mineral acids.

Advantageously, the acid comprises, or alternatively consists essentially of, one or more organic acids. Preferred organic acids are carboxylic acids, e.g., mono-, di- and/or tri-carboxylic acids optionally substituted in a beta position with an hydroxy, carbonyl or amino group. Organic acid species useful in the composition include but are not limited to formic acid, acetic acid, propanoic acid, butyric acid and the like; hydroxy substituted carboxylic acids including but not limited to glycolic acid, lactic acid, tartaric acid and the like; oxalic acid; carbonyl substituted carboxylic acids including but not limited to glyoxylic acid, and the like; amino substituted carboxylic acids including but not limited to glycine, hydroxyethylglycine, cysteine, alanine and the like; cyclic carboxylic acids including but not limited to ascorbic acid and the like; oxalic acid, nitrilotriacetic acid, citric acid, and mixtures thereof.

Mono- and di-carboxylic acids having between 1 and 8 carbon atoms, preferably between 2 and 6 carbon atoms, and are substituted in an alpha, beta, or both positions with an hydroxy and/or carbonyl group, are preferred organic acids. More preferred are organic acids with a carbonyl group substituted on the carbon adjacent to the carboxyl group carbon.

Exemplary preferred organic acids are oxalic acid, glyoxylic acid, glycolic acid, or mixtures thereof. A most preferred organic acid is glyoxylic acid ($C_2H_2O_3$).

The acid is advantageously present at from about 0.05% to about 5%, preferably from about 0.1% to about 2.5%, for example from about 0.15% to about 1.5%. Generally, however, organic acids can have a wide range of carboxylate groups per gram of acid, and a preferred range for a wide variety of acids is between about 0.4% to about 5% acid. The examples showed excellent results were obtained with acid, in this case glyoxylic acid, present at from about 0.3% to about 1.0%.

Defining acid concentrations by weight percent is somewhat broad, however, as the amount of acidic equivalents per unit of weight varies widely among the useful and even among the preferred acids. In an alternate embodiment, the acid is present at from about 0.005 equivalents per liter (Normal) to about 5 equivalents per liter, preferably between about 0.01 and about 1 equivalents per liter, for example between about 0.02 and about 0.3 equivalents per liter. The examples showed excellent results were obtained with the acid present at from about 0.04 to about 0.12 equivalents per liter.

In yet another alternate embodiment, the acid is present in an amount sufficient to provide between about 0.5 and 20 equivalents of acid per equivalent of fluoride provided by the fluoride-containing compound.

The compositions are effective over a wide range of pH, but are most effective at pH 7 or less. Preferably, the pH is between about 1.3 and 4.5, more preferably from about 1.5 to 4, for example from 1.9 to 3.8, and is typically between about 2 and about 3.3, for example between about 2.1 and about 2.8 or 3.1. We have, however, surprising discovered another variant of the invention that is useful at pH 4.5 to 6.5, preferably from 5 to 6.

An important factor in the usefulness of this invention is the large amount of water used in the compositions of this invention. It is generally known to make resist/residue removers comprising fluoride, between 30% to 90% polar organic solvents, which means that the permissible amount of water is less than 70%. Further, the only operative examples in these various prior art references have solvents present in the 40% to 80% ranges, so the amount of water is actually less than the broadest ranges these references purport to teach. Such a high percentage of solvents is costly, increases the danger of a flammable or explosive incident, and makes exposure to the cleaner composition or vapors emanating therefrom more detrimental to workers. The water in the present invention is present in at least about 80%, or alternatively at least 81% or 82% to a maximum of about 97%, for example between about 85% to about 96%. The examples showed excellent results were obtained with compositions having water present at from about 88% to about 95%. In less preferred embodiments of the invention, the water can be present in an amount as low as 75%.

The compositions of this invention can optionally but advantageously comprise a small amount of chelating agent. The chelating agent is advantageously selected from diethylenetriamine pentaacetic acid (DTPA) or its salts, ethylenediamine tetraacetic acid (EDTA) or its salts, and other known phosphonate-containing chelators (including salts thereof) including but not limited to amino trimethyl phosphonic acid, hydroxyethylidene 1,1-diphosphonic acid, hexamethylene diamine tetra methylene phosphonic acid, diethylenetriamine pentamethylene phosphonic acid, and bis hexamethylene triamine penta methylene phosphonic acid. The most preferred chelating agent is hydroxylethylidene 1,1-diphosphonic acid, which can be provided by DEQUEST™ 2010 (available from Solutia, Inc., St. Louis, Mo.) or PHOSRIN™ 303 (available from Omichi Seiyaku, JP).

It is known that some dicarboxylic acids, tricarboxylic acids, and carboxylic acids substituted in the beta position with hydroxy or carbonyl have a significant chelating capacity. If such acids are present, they are included in the composition as an acid, and not as a chelator. Mixed carboxylate/sulfonate compounds, on the other hand, are included in the chelator category.

Advantageously, the composition is substantially free of triazoles, and specifically substantially free of benzotriazole, which is a corrosion inhibitor commonly included in cleaners used on substrates containing copper. First, benzotriazole can deposit on the substrate, and it must be removed before the next processing step. Second, benzotriazole is not believed to be very effective in the compositions of this invention. Substantially free means less than 0.05%, preferably less than 0.01%, most preferably free of triazoles, particularly benzotriazole.

The chelating agent, if present, is present at from about 0.001% to about 10%, typically from about 0.01% to about 5%, for example from about 0.05% to about 1%. Some compositions, especially those having one or more organic acids that have a chelating property, are effective and do not leave excessive absorbed metal ions with little or no additional chelating agent. In such cases, where the organic acid has a chelating effect, there is little to be gained by having more than about 0.03% to about 0.2% of chelating agent.

Metals content of the compositions is preferably kept low in order to meet metallic contamination targets known in the art, and expressed in for example the Interconnect section of The International Technology Roadmap for Semiconductors: 2003. Concentration of metals such as Al, Ca, Cr, Cu, Fe, Mg, Mn, Ni, Pb, K, Na, and Zn generally are kept less than 10 ppm, preferably less than 5 ppm, for example less than 1 ppm.

The compositions of the present invention can optionally contain a small quantity of surfactants. If surfactants are added, between 0.01% and 0.2% is expected to be a sufficient quantity to provide the desired results. In other embodiments of the invention, the composition is substantially free of surfactants.

The compositions may be included as one premixed composition. The advantage of these compositions is they have 48 to more than 72 hour a pot life. Pot life can be extended by periodically or continuously adding a small amount of makeup water approximately equal to the amount of water lost by evaporation from the pot. In an alternate embodiment, the composition can be formed by admixing two or more fluid streams, for example a first stream comprising an aqueous mixture of the active ingredients and a second stream consisting of deionized water (and optionally also a an amount of organic solvent which is beneficially less than the amount of organic solvent in the final composition used to remove resist, residues, and copper oxide from the substrate). In such a case the relative amounts of each stream can be varied to account for changes in composition that occur due to evaporation from a pot. In other embodiments, the second stream can comprise an aqueous mixture that includes one or more active ingredients, so that the composition can be changed during the cleaning process, i.e., by having a higher amount of fluoride in the first solution to contact the wafer and then reducing the amount of fluoride after some predetermined interval of time.

Generally, the cleaning process can be batch or single wafer. There are four most preferred cleaning/removing composition embodiments, the composition of which is shown, below (in weight percent of ingredients admixed to form the compositions):

| Embodiments | A | B | C | D |
|---|---|---|---|---|
| 1) HF and/or NH4F: | 0.01-0.12 | 0.01-0.12 | 0.01-0.12 | 0.01-0.12 |
| 2) Low molecular weight carboxylic acid | 0.9-1.2 | 0.2-0.6 | 0.6-0.9 | 0.75-1.25 |
| 3) Glycol ether | 1.5-5% | 9-12% | 5-9 | 1.5-6% |
| 4) Chelator | 0.02-0.12 | 0.02-0.12 | 0.02-0.12 | 0-0.02 |
| 5) Water | 94.7-97.6 | 87.1-90.8 | 89.8-94.3 | 92.6-97.7 |
| 6) Mineral acid | 0-0.01 | 0-0.01 | 0-0.01 | 0-0.02 |
| 7) pH | 1.8-2.2 | 2.2-2.6 | 2.0-2.3 | 1.7-2.3 |

The ingredient (1) includes ammonium bifluoride. The ammonium can be partially or completely replaced by a C1 to C5 alkyl ammonium compound, and/or by an alkanolamine such as monoethanolamine, where the weight % in the composition are adjusted to provide the same level of fluoride in the composition. By "low molecular weight" we mean an organic acid with an organic acid comprising between 1 and 3 carbon atoms, and between 0 and 1 nitrogen atoms.

The cleaning process is performed to effect removal of one or more of photoresist, etching or planarization residue. The wafer comprises copper, by which we mean the wafer comprises a conductive layer that is at least 50% by weight copper, and is typically greater than 90% by weight copper. These residues can comprise a wide variety of reaction products of various etchants, low-K materials, resists, copper, and barrier materials, which are subjected to a wide variety of temperature conditions. The disclosure of various residues described in U.S. published Application No. 2004/0106531 are incorporated by reference. Cleaning processes fall into batch and single wafer classes. For single wafer treatments of a wide variety of resists, residues, and copper oxide, the composition A is preferred. For selected substrates, and for bath cleaning process treatments of a wide variety of resists, residues, and copper oxide, the composition B is preferred. For batch and single wafer treatments of a wide variety of resists, residues, and copper oxide, the embodiment C is preferred. For single wafer processing of wafers having residue formed from a Trench First/Via Last processing stream, the embodiment D is preferred.

Batch cleaning typically involves multiple wafers, and the cleaning process occurs on the order of minutes, such as 10 to 30 minutes, as the wafers are immersed in or sprayed with the cleaning composition. A batch process is for treating a plurality of wafers, typically 25 to 50, in a treatment tank at one time, where the plurality of wafers are arranged in line to immerse them at one time. Historically, such immersion processes for resist and residue removing took place over a time period of between about 10 minutes to about 1 hour, and generally of about 30 minutes. The cleaning steps were set to match the speed of the assembly line. That is, in the time needed to clean the 25 to 50 wafers in an immersion bath was about the time for the assembly line to produce another 25 to 50 wafers needing cleaning.

To be useful for batch cleaning, the compositions of this invention must have very low copper corrosion rates, and for the "low-K material" the composition must have low dissolution rates and rates of other undesirable interactions (change in dimensions, change in dielectric, and the like). By low rates of copper dissolution, we mean less than about 4 Angstroms per minute, preferably less than 3 Angstroms per minute, more preferably less than 2 Angstroms per minute, for example between about 0.01 to 1 Angstroms per minute, when measured over a period useful for batch cleaning, e.g., dissolution measured after 10 minutes of exposure of the substrate to the composition at conditions (temperature and agitation) found in a batch cleaning operation. By low rates of low-k material dissolution, we mean less than about 2 Angstroms per minute, preferably less than 1 Angstrom per minute, for example between about 0.01 to 1 Angstroms per minute, when measured over a period useful for batch cleaning, e.g., dissolution measured after 10 minutes of exposure of the substrate to the composition at conditions (temperature and agitation) found in a batch cleaning operation.

It is desirable that the composition of this invention be able to remove resist and residue, but also that the composition be able to quickly remove copper oxide from copper. One problem with copper is the metal has a strong tendency to form copper oxide, both in etching and ashing processes, but also in handling the wafers in ambient conditions. For this reason, cleaning, handling, and drying of the copper-containing wafers is beneficially done under an inert atmosphere, for example under nitrogen. Generally, a layer of copper oxide once formed will protect underlying metal for time frames encountered in integrated circuit manufacturing, so the layer of copper oxide on metal may be thin. However, even a thin layer will impart unacceptable resistances in a conductor. Many removers can remove copper oxide in a time frame of minutes, but it is more difficult to remove a layer of copper oxide in 10 to 30 seconds, such as would be desirable for single wafer processing.

One mechanism for achieving greater control of the cleaning/removing process is through the use of single wafer processing. A single wafer type of apparatus is for transferring wafers into the treatment "tank" to treat wafers one by one. Generally, the cleaning liquid is sprayed to the surface of the wafer while the wafer is rotated, so that washing is performed. Cleaning is achieved by causing cleaning fluid to spread uniformly over the entire top surface (and often also over the entire undersurface) of the wafer by a centrifugal force by the rotation of the wafer. The single wafer cleaning process occurs on the order of seconds, such as 10 to 60 seconds, as the composition is dispensed onto a spinning wafer.

Cleaning ability in both process classes is a desired characteristic. Many prior art removers, which were developed to treat wafers and to remove residue in about 30 minutes, are inadequate to clean the wafers if the single wafer cleaning is to keep pace with the line. Such processes require effective residue remover compositions that are capable of cleaning the substrate in less than 90 seconds in order for the single-wafer cleaning process equipment to become a productive tool. Preferably, the cleaner when used in a single wafer cleaning apparatus requires between 45 and 90 seconds to remove the resist and residue. The compositions must also be able to remove copper oxide in the same (or shorter) number of seconds. The preferred compositions of this invention meet this requirement.

Agitation such as circulation and recirculation, pulsed flow, ultrasonics and megasonics, and the like may be used, both in the batch method and in the single wafer method of cleaning wafer substrates.

During the cleaning process the temperature of the composition may range from about 10° C. to boiling temperature, but is typically less than about 90° C., preferably from about 20° C. to about 70° C., for example from about 25° C. to about 45° C.

It is not necessary that the residue remover be used to remove a combination of etching residue and copper oxide. The residue remover can be useful to for example merely remove copper oxide prior to a subsequent manufacturing operation, where the low impact the residue remover formulation has on both the metals and the dielctric materials makes this a formulation of choise even for this routine task.

A rinse step may then be performed using for example water, an organic such as isopropanol, or a mixed water/organic solution. For single wafer processing, removal of the composition of this invention with an air knife or equivalent may precede the rinse step. A drying step may then be performed where warm gas, such as nitrogen, is flowed across the wafer.

EXAMPLES

Compositions were prepared and tested as described in the following examples.

Wafers comprising copper and TEOS were exposed to the compositions for 10 minutes at about 25° C. Changes in thickness of copper and TEOS were converted to copper and TEOS loss rates in Angstroms per minute. Additionally, a copper oxide layer was formed over a copper-containing wafer by exposing the copper-containing wafer to aqueous hydrogen peroxide for about 3 hours. The time, in seconds, between contacting the substrate with the compositions until the copper oxide was visually determined to be gone was measured in seconds. In the various tests, thickness measurements were made with a Nanometrics Nanospec 6100XMP™; Dielectric constant measurements were made with a 4 Dimension CVMap 3092A Mercury Probe™; and Metal etch measurements were made with a 4 Dimension™ 280SI 4 Point Probe. Flash point measurements were made using both open cup and closed cup methods—in no case was a flash point reached in any of the tests, and the data presented is for closed cup tests.

Comparative Example 1

To evaluate various glycol ethers a series of four compositions was prepared. Comparative Examples C1 to C4 had only about 59% water; 0.1% ammonium fluoride; 0.5% glyoxylic acid monohydrate; 6% of the chelator HEDP (1-hydroxyethylidene-1,1-diphosphonic acid) and about 0.4% phosphonic acid [each provided by adding 10% DEQUEST 2010™, where the DEQUEST 2010™ is assumed to contain 60% HEDP (CAS 2809-21-4), 4% phosphonic acid (CAS 13598-36-2), and water]; and 34.5% of PGME, DGME, DGBE, and DGPE, respectively. Each composition had a pH of about 1.5. This data is also provided in Table 1 below.

TABLE 1

| Table 1 | | | | | | | |
|---|---|---|---|---|---|---|---|
| | C1 | C2 | C3 | C4 | C5 | C6 | C7 |
| NH4F | 0.1 | 0.1 | 0.1 | 0.1 | 0.04 | 0.04 | 0.04 |
| SOLVENT | | | | | | | |
| PGME | 34.5 | | | | | | |
| DGPE | | | | 34.5 | | | |
| DGEE | | | | | | | |
| DGBE | | | 34.5 | | | 17.5 | |
| PGEE | | | | | 17.5 | | |
| DPGME | | | | | | | 17.5 |
| DGME | | 34.5 | | | | | |
| Glyoxylic acid monohydrate | 0.5 | 0.5 | 0.5 | 0.5 | 1.0 | 1.0 | 1.0 |
| Water (balance) | 58.5 | 58.5 | 58.5 | 58.5 | 75.1 | 75.1 | 75.1 |
| HEDP | 6 | 6 | 6 | 6 | 6 | 6 | 6 |
| phosphonic acid | 0.4 | 0.4 | 0.4 | 0.4 | 0.4 | 0.4 | 0.4 |
| pH | 1.50 | 1.50 | 1.50 | 1.50 | 1.50 | 1.50 | 1.50 |

TABLE 1-continued

| Table 1 | | | | | | | |
|---|---|---|---|---|---|---|---|
| | C1 | C2 | C3 | C4 | C5 | C6 | C7 |
| Material removed in 10 min | | | | | | | |
| Cu (A/min) | 3 | 3 | 3 | 3 | 2 | 2 | 2 |
| TEOS (A/min) | 0.9 | 0.8 | 1.1 | 1.2 | 0.5 | 0.8 | 0.8 |
| CuOx removal time (sec) | 2 | 2 | 2 | 2 | 2 | 2 | 2 |

The 3 Angstrom per minute copper loss rate was higher than desired but was the same for each of comparative examples C1 to C4. The 2 seconds needed to remove copper oxide was lower than necessary but again was the same for each of comparative examples C1 to C4. TEOS loss was lowest with comparative example C2 (containing DGME), followed closely by comparative example C1 (containing PGME). TEOS loss rates were significantly higher with comparative examples C3 and C4.

Comparative Example 2

To evaluate additional glycol ethers, a series of three compositions was prepared. Comparative Examples C5 to C7 had only about 75% water; 0.04% ammonium fluoride; 1% glyoxylic acid monohydrate; 6% of the chelator HEDP (1-hydroxyethylidene-1,1-diphosphonic acid) and about 0.4% phosphonic acid (each provided by adding 10% DEQUEST 2010™); and 17.5% of PGEE, DGBE, and DPGME, respectively. Each composition again had a pH of about 1.5. Wafers comprising copper and TEOS were exposed to the comparative compositions for 10 minutes at about 25° C. This data is also presented in Table 1. The 2 Angstrom per minute copper loss rate was a significant improvement over the copper etch rate observed with comparative examples C1 to C4, but was still higher than desired. The 2 seconds needed to remove copper oxide was also still lower than necessary. TEOS loss was lowest with comparative example C5 (containing PGEE), was significantly lower than that observed with comparative examples C6 and C7. From these first two examples, we determined that PGEE, DGME, and PGME were preferred glycol ethers.

Example 3

To evaluate organic acids, a series of ten compositions was prepared. Samples 1 to 10 had about 81.4% water; 0.04% ammonium fluoride; 0.06% of the chelator HEDP (1-hydroxyethylidene-1,1-diphosphonic acid) and about 0.004% phosphonic or phosphorous acid (the chelator and phosphonic or phosphorous acid provided by adding 0.1% DEQUEST 2010™); 17.5% of PGME, and 1% of formic acid, acetic acid, propionic acid, butyric acid, oxalic acid, glycolic acid, tartaric acid, citric acid, glyoxylic acid (monohydrate), and ascorbic acid, respectively. Each composition had a pH of about 2.7 to about 2.8. Wafers comprising copper and TEOS were exposed to these compositions for 10 minutes at about 25° C. This data is presented in Table 2.

The copper loss rate was high, e.g., 3 Angstroms/minute, for Sample 1 (containing formic acid), Sample 6 (containing glycolic acid), Sample 7 (containing tartaric acid), and Sample 8 (containing citric acid). The copper loss rate was acceptable, e.g., 2 Angstroms/minute, for Sample 2 (containing acetic acid), Sample 9 (containing glyoxylic acid monohydrate), and sample 10 (containing ascorbic acid). Finally, the copper loss rate was low, e.g., 1 Angstrom/minute, for Samples 3, 4, and 5 containing propionic, butyric, and oxalic acids, respectively.

The TEOS loss rate was acceptable, e.g., 1 Angstrom/minute, for all samples, though the rate was slightly lower for Samples 3, 4, and 5 containing propionic, butyric, and oxalic acids, respectively.

The 12 seconds needed to remove copper oxide was sufficiently fast to utilize these compositions in single wafer processing operations. Generally, single wafer processing requires a time to clean (measured in such a static test environment) of 30 seconds or less.

butyric acids, these acids are not most preferred because they have a lower chelating capacity than do the most preferred organic acids.

Example 5

A third series of tests were run to evaluate amino acids. Samples 11 to 14 had about 88.9% water; 0.04% ammonium fluoride; 0.06% of the chelator HEDP (1-hydroxyethylidene-1,1-diphosphonic acid) and about 0.004% phosphonic acid (each provided by adding 0.1% DEQUEST 2010™); 10% of PGME, and 1% of various amino acids: glycine, hydroxyethyl glycine, cysteine, and alanine, respectively. Each composition also had a pH of about 2.6. Wafers comprising copper and TEOS were exposed to these compositions for 10 minutes at about 25° C. The data for these samples 11 to 14 are also presented in Table 3.

TABLE 2

| | 1 | 2 | 3 | 4 | 5 | 6 | 7 | 8 | 9 | 10 |
|---|---|---|---|---|---|---|---|---|---|---|
| NH4F | 0.04 | 0.04 | 0.04 | 0.04 | 0.04 | 0.04 | 0.04 | 0.04 | 0.04 | 0.04 |
| SOLVENT | | | | | | | | | | |
| PGME | 17.5 | 17.5 | 17.5 | 17.5 | 17.5 | 17.5 | 17.5 | 17.5 | 17.5 | 17.5 |
| Formic acid | 1.0 | | | | | | | | | |
| Acetic acid | | 1.0 | | | | | | | | |
| Propionic acid | | | 1.0 | | | | | | | |
| Butyric acid | | | | 1.0 | | | | | | |
| Oxalic acid | | | | | 1.0 | | | | | |
| Glycolic | | | | | | 1.0 | | | | |
| Tartaric | | | | | | | 1.0 | | | |
| Citric | | | | | | | | 1.0 | | |
| Glyoxylic hydrate) | | | | | | | | | 1.0 | |
| Ascorbic | | | | | | | | | | 1.0 |
| Water (balance) | 81.4 | 81.4 | 81.4 | 81.4 | 81.4 | 81.4 | 81.4 | 81.4 | 81.4 | 81.4 |
| HEDP | 0.06 | 0.06 | 0.06 | 0.06 | 0.06 | 0.06 | 0.06 | 0.06 | 0.06 | 0.06 |
| phosphonic acid | 0.004 | 0.004 | 0.004 | 0.004 | 0.004 | 0.004 | 0.004 | 0.004 | 0.004 | 0.004 |
| PH | 2.7 | 2.8 | 2.7 | 2.7 | 2.7 | 2.7 | 2.8 | 2.7 | 2.8 | 2.8 |
| Material removed in 10 min | | | | | | | | | | |
| Cu (A/min) | 3 | 2 | 1 | 1 | 1 | 3 | 3 | 3 | 2 | 2 |
| TEOS (A/min) | 1 | 1 | 0.8 | 0.8 | 0.8 | 1 | 1 | 1 | 1 | 1 |
| CuOx removal time (sec) | 12 | 12 | 12 | 12 | 12 | 12 | 12 | 12 | 12 | 12 |

From these tests, we determined that from a performance perspective oxalic acid, glyoxylic acid monohydrate, and/or ascorbic acid are the most preferred organic acids. From a cost perspective, oxalic acid and/or glyoxylic acid monohydrate are most preferred organic acids. Formic acid, glycolic acid, tartaric acid, and citric acid were less preferred acids, as compared to for example oxalic acid, glyoxylic acid monohydrate and/or ascorbic acid, because compositions containing these acids had higher, albeit acceptable for some applications, copper etch rates. Further, while the copper etch rate was acceptable in compositions using acetic acid, and were actually low for compositions containing propionic and

TABLE 3

| | 11 | 12 | 13 | 14 |
|---|---|---|---|---|
| NH4F | 0.04 | 0.04 | 0.04 | 0.04 |
| PGME | 10.0 | 10.0 | 10.0 | 10.0 |
| ACID | | | | |
| Glycine | 1.0 | | | |
| hydroxyethyl glycine | | 1.0 | | |
| Cysteine | | | 1.0 | |
| Alanine | | | | 1.0 |

TABLE 3-continued

Table 3

|  | 11 | 12 | 13 | 14 |
|---|---|---|---|---|
| Water (balance) | 88.9 | 88.9 | 88.9 | 88.9 |
| Phosphonic acid | 0.004 | 0.004 | 0.004 | 0.004 |
| HEDP* | 0.06 | 0.06 | 0.06 | 0.06 | and the data from sample 9 is also reproduced in Table 4 for ease of comparison. Samples 9, 15 and 16 each had about 0.04% ammonium fluoride; and 0.06% of the chelator HEDP (1-hydroxyethylidene-1,1-diphosphonic acid) and about 0.004% phosphonic acid (each provided by adding 0.1% DEQUEST 2010TM); where the balance of each sample contained only glyoxylic acid monohydrate, PGME, and water. Wafers comprising copper and TEOS were exposed to these compositions for 10 minutes at about 25° C.

TABLE 4

Table 4

|  | 9 | 15 | 16 | 17 | 18 | 19 | 20 | 21 | 22 | 23 |
|---|---|---|---|---|---|---|---|---|---|---|
| NH4F | 0.04 | 0.04 | 0.04 | 0.04 | 0.04 | 0.04 | 0.04 | 0.04 | 0.04 | 0.04 |
| PGME | 17.5 | 2.5 | 10.0 | 7.5 | 2.5 | 7.5 | 2.5 | 2.5 | 2.5 | 2.5 |
| Glyoxylic acid MH | 1 | 2.5 | 1.0 | 2.0 | 2.5 | 2.0 | 2.5 | 2.5 | 2.5 | 2.5 |
| Water (balance) | 81.4 | 94.9 | 88.9 | 90.4 | 95.5 | 90.5 | 94.9 | 94.9 | 94.9 | 94.9 |
| Phosphonic acid | 0.004 | 0.004 | 0.004 |  |  |  | 0.003 |  |  |  |
| HEDP** | 0.06 | 0.06 | 0.06 | 0.05* |  |  |  |  |  |  |
| ATMP*** |  |  |  |  |  |  | 0.05 |  |  |  |
| DPTA |  |  |  |  |  |  |  |  | 0.1 |  |
| EDTA |  |  |  |  |  |  |  | 0.1 |  |  |
| N-(2-Hydroxyethyl)ethylenediamine-N,N',N'-triacetic acid |  |  |  |  |  |  |  |  |  | 0.1 |
| pH | 2.8 | 2.14 | 2.60 | 2.4 | 2.2 | 2.5 | 2.1 | 2.1 | 2.1 | 2.1 |
| Material in 10 min |  |  |  |  |  |  |  |  |  |  |
| Cu (A/min) | 2 | 2 | 1 | 1 | 3 | 3 | 2 | 1 | 1 | 1 |
| TEOS (A/min) | 1 | 1 | 1 | 1 | 1 | 1 | 1 | 0.5 | 0.6 | 1 |
| CuOx removal time (sec) | 12 | 3 | 10 | 6 | 6 | 10 | 3 | 3 | 3 | 3 |

*From PHOSRIN 303 available from Omichi Seiyaku.
**From Dequest 2010.
***From Dequest 2000.

TABLE 3-continued

Table 3

|  | 11 | 12 | 13 | 14 |
|---|---|---|---|---|
| pH | 2.6 | 2.6 | 2.6 | 2.6 |
| Material removed in 10 min |  |  |  |  |
| Cu (A/min) | 2 | 2 | 1 | 1 |
| TEOS(A/min) | 1 | 1 | 1 | 1 |
| CuOx removal (sec) | 10 | 10 | 10 | 10 |

The copper loss rate was acceptable, e.g., only 2 Angstroms per minute, for samples 11 (containing glycine) and 12 (containing hydroxyethyl glycine). Copper etch rates were low (1 Angstrom/minute) for samples 13 (containing cysteine) and sample 14 (containing alanine). The TEOS loss rate was low (1 Angstrom/minute) for each of samples 11 to 14, and the 10 seconds needed to remove copper oxide was sufficiently fast to utilize each of these compositions in single wafer processing operations.

Example 6

A series of tests were run to evaluate combinations of glyoxylic acid concentrations and PGME concentrations. The data for these samples 15 and 16 are presented in Table 4, The data show that sample 16, having a pH of 2.6, 1% glyoxylic acid monohydrate and 10% PGME, had a copper etch rate that was about one half the extremes represented by samples 9 and 15. This data suggests that lowest copper etch rates would be realized if: A) the pH is maintained between 2.14 and 2.8, say for example in the range of 2.4 to 2.7; B) the glycol ether (preferably PGME) concentration is between 2.5% and 17.5%, say about 5% to about 15%; C) the acid (preferably glyoxylic acid monohydrate and/or an amino acid such as was used in samples 11 to 14) is present in an amount near 1%, say for example between 0.5% and 1.5%, and D) the water concentration is between 81% and 94.5%, say for example between about 85% to about 92%.

Example 7

A series of tests were run to evaluate various chelators. The samples for this Example are samples 15 and 17 to 23, and the compositions and data are presented in Table 4.

Samples 15, 18, and 21 to 23 each had about 0.04% ammonium fluoride; 2.5% PGME; 2.5% glyoxylic acid monohydrate; and balance water. Sample 15 had 0.06% HEDP and a trace of phosphorous and/or phosphonic acid from adding 0.1% of Dequest 2010; Sample 18 had no chelator; Sample 20 has 0.05% ATMP and a trace of phosphorous and/or phosphonic acid from adding 0.1% of Dequest 2000; Sample 21 had 0.1% EDTA, Sample 22 had 0.1% DPTA, and Sample 23 had 0.1% N-(2-Hydroxyethyl) ethylenediamine-N,N',N'-triacetic acid.

Sample 18, the only sample with no chelator, has a high copper etch rate, e.g., 3 Angstroms per minute. Samples 15 and 20, one containing 0.06% HEDP and the other containing about 0.05% ATMP, had acceptable copper etch rates, e.g., 2 Angstroms/minute. We note that both of these samples apparently contain a trace, e.g., 0.003% to 0.004%, of phosphonic acid and/or phosphorous acid (the information from the Material Safety Data Sheets is unclear).

The lowest copper etch rates, e.g., 1 Angstrom/minute, were observed in samples 21 to 23, containing EDTA, DPTA, and N-(2-Hydroxyethyl) ethylenediamine-N,N',N'-triacetic acid, respectively. Further, samples 21 and 22 had very low TEOS etch rates.

From this data, we believe that EDTA, DPTA, and EDTA-like derivatives such as N-(2-Hydroxyethyl)ethylenediamine-N,N',N'-triacetic acid are all highly preferred chelators. Further, HEDP and ATMP are also highly preferred chelators, with HEDP being more preferred of the two. Use of compositions without a chelator are possible, but the copper etch rate may be somewhat higher. This data also suggests that the chelators may also have a small protective function. It is known that copper ions in solution will increase copper metal dissolution, so the possibility that the protective function is simply chelating copper ions (which would otherwise accelerate metal dissolution) cannot be discounted. The 50% lower amount of time needed to remove copper oxide in each of samples 15 and 20 to 23 comprising a chelator, when compared to the sample 18 without any chelator, is evidence the HEDP has a chelating function and/or accelerates the removal of copper oxide.

The presence of HEDP was evaluated at with a more moderate composition comprising 7.5% PGME and 2% glyoxylic acid monohydrate in samples 17 and 19. Sample 17 had 0.05% HEDP, while sample 19 had no chelator. Again, the sample with no chelator had a high copper etch rate, e.g., 3 Angstroms/minute, while the sample having an identical composition except with the addition of 0.05% HEDP had a low copper etch rate, e.g., 1 Angstrom/minute. This again suggests that HEDP has a protective function. The almost 50% lower amount of time needed to remove copper oxide, in the sample with HEDP as compared to the sample without any chelator is evidence the HEDP has a chelating function and/or accelerates the removal of copper oxide.

Example 8

The samples A to K in Table 5 were used in a wide variety of tests. In Table 5: 1) NH4F is ammonium fluoride, 2) PGME is propylene glycol monomethyl ether; and 3) Glyoxylic Acid MH is Glyoxylic acid monohydrate.

Example 8-A

To show compatibility with common materials used in manufacturing copper-low-k material-containing integrated circuits, wafers were immersed in samples A, B, I and J at 25° C. for 10 minutes, and the total loss over that time is shown in Table 6. Thickness of dielectric was measured with a Nanometrics Nanospec™ model 6100XMP, and of metals with 4 Dimension™ 280SI 4 Point Probe.

TABLE 6

Material loss (in Angstroms) after immersion at 25° C. for ten minutes

| Sample | A | B | I | J |
|---|---|---|---|---|
| Cu loss | 18 | 10 | 10 | 30 |
| TEOS loss | 9 | 7 | 8 | 6 |
| SiN loss | 5 | 5 | — | — |
| SiON loss | 6 | 7 | — | — |
| Copper oxide removal time, seconds | 3 | 12 | 6 | 11 |

Example 8-B

To show compatibility with various low-k dielectrics, samples of a variety of dielectrics were immersed in baths of Compositions A, B, and I for 10 minutes at 25° C. Initial thickness of the dielectric film was recorded in Angstroms as was the thickness post-immersion, and the change in thickness was determined. Thickness was measured with a Nanometrics Nanospec model 6100XMP. The data is presented in Table 7. The data show there is very little change in thickness (less than 8 angstroms, typically less than 4 angstroms) for the low-k dielectric materials after a 10-minute exposure to sample A, B, and I. Samples A, B, and I contain 0.04% ammonium fluoride; 0.4% to 1% glyoxylic acid monohydrate; 2.5% to 10% PGME; 0.06% HEDP; and 89.5% to 96.4% water. The composition of sample I is an intermediate between the compositions of samples A and B. Most low-k materials tested had a positive or zero swelling with one of samples A, B, or I, and a negative or zero swelling with the other of samples A, B, or I. This suggests that samples having compositions between those of samples A, B, and I can be prepared for the various low-k materials to further minimize swelling.

TABLE 5

Table 5

| | A | B | C | D | E | F | G | H | I | J | K |
|---|---|---|---|---|---|---|---|---|---|---|---|
| NH4F | 0.04 | 0.04 | 0.08 | 0.12 | 0.04 | 0.08 | 0.12 | 0.04 | 0.04 | 0.04 | 0.04 |
| PGME | 2.5 | 10.0 | 10.0 | 10.0 | 10.0 | 10.0 | 10.0 | 5.0 | 7.5 | 2.5 | 7.5 |
| Glyoxylic Acid MH | 1.0 | 0.4 | 0.4 | 0.4 | 0.4 | 0.4 | 0.4 | 0.4 | 0.8 | 1.0 | 0.8 |
| Water | 96.4 | 89.5 | 89.5 | 89.4 | 89.6 | 89.5 | 89.5 | 94.5 | 91.6 | 96.5 | 91.7 |
| HEDP | 0.06 | 0.06 | 0.06 | 0.06 | 0 | 0 | 0 | 0.05 | 0.05 | 0 | 0 |
| PH | 1.99-2.1 | 2.38-2.6 | 2.82 | 3.01 | 2.70 | 3.00 | 3.13 | 2.0-2.5 | 2.0-2.5 | 2.0-2.5 | 2.0-2.5 |

TABLE 7

Change in thickness after immersion for 10 minutes at 25° C.

| Low K Dielectric | A | | B | | I | |
|---|---|---|---|---|---|---|
| | Initial | Delta | Initial | Delta | Initial | Delta |
| Black Diamond 1 | 4976 | −7 | 4973 | 0 | 4148 | −8 |
| Black Diamond 2 | 1357 | 1 | 1359 | 0 | 1372 | −1 |
| Aurora 2.7 | 2541 | +7 | 2573 | +1 | 2530 | +3 |
| Aurora 2.4 | 5009 | −7 | 5128 | +8 | 5145 | −7 |
| SiLK J | 1245 | +2 | 1258 | −1 | 1255 | +1 |
| SiLK Y | 1202 | 0 | 1194 | +7 | 1200 | +4 |
| LKD5530 | 1517 | +3 | 1519 | −1 | 1509 | +2 |
| LKD5109 | 1509 | −2 | 1512 | +1 | 1511 | +1 |
| Coral | 4313 | +4 | 4308 | +2 | 4260 | −2 |

Similar 10-minute immersion tests were performed on two dielectric materials, Black Diamond 2 and Coral, using sample J (similar in composition to sample A but with no inhibitor) at both 25° and at 45° C. For a nominal thickness of 4100 angstroms of Black Diamond 2, the delta was −3 angstroms at 25° C. and positive 0.9 angstroms at 45° C. For a nominal thickness of 4300 angstroms of Coral, the delta was −4 angstroms at 25° C. and positive 17 angstroms at 45° C. The absence of the 0.06% HEDP in sample I increased both Black Diamond 2 and Coral material loss compared to that observed for sample A.

Example 8-C

To show compatibility with various low-k dielectrics, samples of the dielectrics were immersed in baths of each of compositions A, B, or I for 10 minutes at 25° C. and then baked at 200° C. for 10 minutes. Initial dielectric constant of the film was recorded as was the value post-baking, and the change was determined. Dielectric constant was measured with a 4 Dimension CVMap 3092A Mercury Probe. The data is presented in Table 8. The data show very small changes in the measured dielectric constant after the cleaning (immersion in the composition, drying, and baking) for most dielectric materials. Generally, changes of about 0.05 or less are good, and changes of 0.03 or less are excellent, for most applications.

TABLE 8

| Low K Dielectric | A | | B | | I | |
|---|---|---|---|---|---|---|
| | Initial | Delta | Initial | Delta | Initial | Delta |
| Black Diamond 1 | 2.86 | +0.03 | 2.86 | +0.03 | 2.86 | +0.03 |
| Black Diamond 2 | 2.66 | +0.05 | 2.66 | +0.02 | 2.66 | +0.03 |
| Aurora 2.7 | 2.55 | +0.03 | 2.55 | +0.04 | 2.55 | +0.03 |
| Aurora 2.4 | 2.79 | +0.04 | 2.79 | 0 | 2.79 | 0 |
| SiLK J | 2.63 | +0.02 | 2.63 | +0.02 | 2.63 | +0.01 |
| SiLK Y | 2.44 | 0 | 2.44 | +0.01 | 2.44 | +0.01 |
| LKD5530 | 1.97 | +0.10 | 1.97 | +0.14 | 1.97 | +0.13 |
| LKD5109 | 2.00 | +0.16 | 2.00 | +0.20 | 2.00 | +0.18 |
| Coral | 2.72 | +0.05 | 2.72 | +0.02 | 2.72 | +0.03 |

Example 8-D

To show that the composition J, with no chelator, was compatible with Black Diamond 2 and with Coral, the change in the refractive index was determined after samples had been immersed in sample I for 10 minutes, at 25° C. and at 45° C., and then baked at 200° C. for 10 minutes. For samples immersed at 25° C., the initial refractive index was about 1.4 and the change after immersion and baking was less than 0.001. There was more alteration of the substrate when immersed at 45° C., with the refractive index dropping 0.001 for the Black Diamond 2 material and increasing 0.003 for the Coral material.

Example 8-E

To show compatibility with Black Diamond, Aurora 2.7, SiLK Y, and Coral, the contact angle between the dielectric materials and samples A, B, and I were determined. Data is presented in Table 9. Substantial changes in the wettability of the compositions was found for SiLK Y and Coral, though the variations in the compositions were fairly minor. Little or no difference was noticed between the samples for Black Diamond and Aurora 2.7. Note, as the composition of sample I is an intermediate between the compositions of samples A and B, then if no significant difference is observed in the measured contact angle for samples A and B (as is the case for Aurora 2.7) then no change is expected for the measured contact angle between either samples A or B and sample I.

TABLE 9

| | Contact Angle | | |
|---|---|---|---|
| | Contact Angle, ° | | |
| | A | B | I |
| Black Diamond | 59.0 | 59.2 | 59.2 |
| Aurora 2.7 | 83.0 | 82.2 | — |
| SiLK Y | 68.3 | 47.9 | — |
| Coral | 99.1 | 78.0 | 79.2 |

Example 8-F

To show that the compositions are not flammable, each of compositions A and B was tested in a closed cup flash point apparatus at temperatures up to 110° C. Both compositions have a flash point greater than 110° C.

Example 8-G

Some fabrication plants increase the temperature of the cleaning baths to shorten cleaning times. At the same time, the manufacturers still want a wide process window, so that over-processing will not result in excessive material loss or alteration. To show compatibility with various low-k dielectrics over a wide range of operating temperatures, Copper and TEOS wafers were immersed in samples A, B and I at a variety of temperatures, i.e., 25° C., 30° C., 35° C., and 40° C. For samples A and B wafers were removed after 2 minutes, after 5 minutes, after 10 minutes, and after 30 minutes, and material loss was determined. Thickness was measured with a Nanometrics Nanospec model 6100XMP. For Sample I, having a composition that is intermediate between the compositions of samples A and B, data was obtained only after 10 minutes of immersion. The data is shown in Tables 10 for TEOS loss and Table 11 for copper loss.

TABLE 10

Angstroms of TEOS Loss On Immersion Between 25° to 40° C.

| TEOS loss, angstroms | A, 2 min. | A, 5 min. | A, 10 min. | A, 30 min. | B, 2 min. | B, 5 min. | B, 10 min. | B, 30 min. | I, 10 min. |
|---|---|---|---|---|---|---|---|---|---|
| 25° C. | 2 | 6 | 9 | 15 | 2 | 6 | 8 | 18 | 6 |
| 30° C. | 1 | 4 | 6 | 17 | 0 | 7 | 9 | 17 | |
| 35° C. | 3 | 7 | 10 | 19 | 3 | 3 | 9 | 18 | 9 |
| 40° C. | 3 | 6 | 7 | 18 | 2 | 4 | 8 | 19 | |
| 45° C. | | | | | | | | | 9 |

The TEOS loss started at about 1 to 2 angstroms per minute at 25° to 30° C., but declined after the first 2 minutes or so to a rate of about half an angstrom per minute. At higher processing temperatures, the TEOS loss started at about 2 to 3 angstroms per minute (at 25° to 30° C., but declined after the first 2 minutes or so to a rate of about half an angstrom per minute. Such TEOS loss rates are excellent, as wafers will still be useful even after substantial over-processing.

TABLE 11

Angstroms of Copper Loss On Immersion Between 25° to 40° C.

| Copper loss, angstroms | A, 2 min. | A, 5 min. | A, 10 min. | A, 30 min. | B, 2 min. | B, 5 min. | B, 10 min. | B, 30 min. | I, 10 min. |
|---|---|---|---|---|---|---|---|---|---|
| 25° C. | 8 | 18 | 23 | 45 | 10 | 11 | 13 | 21 | 30 |
| 30° C. | 20 | 24 | 30 | 87 | 17 | 37 | 34 | 46 | |
| 35° C. | 26 | 46 | 50 | 116 | 21 | 28 | 42 | 70 | 30 |
| 40° C. | 32 | 41 | 57 | 125 | 24 | 33 | 53 | 124 | |
| 45° C. | | | | | | | | | 51 |

The etch rate varies with time and temperature. The variation with time is F "passivation", where it is believed fluoride ions adhere to the metal and reduce the metal loss rate. There is initially a very high etch rate which quickly reaches a self-limiting value. For example, for sample A at 25° C., the average material rate loss (measured over the first two minutes) was about 4 angstroms per minute. The average material rate loss over the next three minutes declined to 3 angstroms per minute, and then to 1 angstrom per minute thereafter. So, the passivation apparently reached a steady-state after 5 minutes. At 35° C., the average material loss rate was 13 angstroms per minute for the first two minutes, 7 angstroms per minute for the next three minute period, and the to about 3 angstroms per minute thereafter.

Example 8-H

Wafers containing heavy residues comprised mainly of TiN generated during an etch process were provided. The wafers, having heavy residues, were immersed in a static bath of each of compositions E, K or L at 45° C. for 120 seconds. Inspection by SEM showed complete cleaning of the residues without undue damage to the substrates, such that the substrate can continue manufacturing to provide a functional integrated circuit.

Example 8-I

Wafers containing post-etch residues in via structures formed on copper/FSG substrates were provided. The wafers, having residues, were immersed in a static bath of each of compositions A and B at each of 25° C. and 35° C. for each of 60, 120 and 600 seconds. Inspection by SEM showed complete cleaning of the residues without undue damage to the substrates, such that the substrate can continue manufacturing to provide a functional integrated circuit. In particular, inspection by SEM showed complete cleaning of the residues in 60 seconds—the earliest time an observation was made. Further, extensive over-processing to 10 minutes did not result in any appreciable copper etching or loss of critical dimension. In general there was little to distinguish between the activity of samples A, B, and I, except that results for the LSI wafers sample A was significantly better at cleaning in short single wafer relevant times.

Example 8-J

Wafers containing post-etch residues in via structures formed on copper/Aurora substrates were provided. The wafers, having residues, were immersed in a static bath of each of compositions A and B at each of 25° C. and 35° C. for each of 60, 120 and 600 seconds. Inspection by SEM showed complete cleaning of the residues without undue damage to the substrates, such that the substrate can continue manufacturing to provide a functional integrated circuit. In particular, inspection by SEM showed complete cleaning of the residues in 60 seconds—the earliest time an observation was made. Further, extensive over-processing to 10 minutes did not result in any appreciable copper etching or loss of critical dimension.

Example 8-K

The preferred temperature for use of the compositions of this invention are between 15° C. and 35° C., preferably between 20° C. and about 30° C., for example at a temperature of 25° C. (plus or minus 2° C.). Bath life is an important criteria for manufacturers. One method of evaluating bath life is a beaker test, where a composition is placed in a beaker exposed to ambient conditions and held at a constant temperature. Changes in various properties over time are then measured.

Seventy-two hour beaker tests were performed on sample A at room temperature (~21° C. to 25° C.) and 35° C., with properties being measured every 24 hours. At 21° C. to 25° C., the density of the composition A changed by less than 0.0001 grams/cc over 72 hours. The pH changed by less than 0.002 from its initial value of 1.993. There was, however, small changes in the amounts of various components. In particular, the concentration of ammonium fluoride increased linearly over time at a rate of about 0.0013% per day, so after 72 hours the amount of ammonium fluoride had increased a total of about 0.004%. The concentration of HEDP also increased linearly over time at a rate of about 0.0013% per day, so after 72 hours the amount of HEDP had increased a total of about 0.004%. The concentration of glyoxylic acid increased from 1.045% to about 1.11% over 72 hours. Finally, the concentration of PGME declined from about 2.47% to about 2.31% in the first 24 hours, but then did not change over the next 48 hours.

At 35° C., the changes in composition A were more substantial. Density increased linearly over time at a rate of about 0.0005 grams/cc per day. The concentration of HEDP increased linearly from 0.056% to 0.074% in 72 hours, and the concentration of ammonium fluoride increased linearly from 0.043% to 0.056% in 72 hours. The concentration of glyoxylic acid increased linearly from 1.045% at time zero to 1.32% 72 hours later. Nevertheless, the pH declined from an initial value of 1.992 to 1.943 seventy-two hours later. The concentration of PGME declined from about 2.47% to about 2.31% in the first 24 hours (the same change noted at in the test at 25° C.), but then dropped to a low of 2.24% at 48 hours. The concentration at this point then increased, eventually reaching 2.32% at the end of the 72-hour test.

Seventy-two hour beaker tests were also performed on sample B at room temperature (~21° C. to 25° C.) and 35° C., with properties being measured every 24 hours. At 21° C. to 25° C., the density of the composition increased by about 0.0001 grams/cc over 72 hours. The pH changed by less than 0.002 from its initial value of 2.382. The concentration of ammonium fluoride increased from 0.038% to about 0.039%, which was substantially lower than for Sample A. The concentration of HEDP increased slightly, from 0.053% to about 0.055% over 72 hours. The concentration of glyoxylic acid increased from 0.408% to about 0.437% over 72 hours. Finally, the concentration of PGME increased from about 9.7% originally to 10.45% at the end of 72 hours. On reviewing the bath-life data for sample B, no significant variation was observed at 25° C. for any of the measured parameters out to 72 hours. The cleaning efficiency and compatibility properties of composition B would be within accepted allowances even after an open beaker of sample B was left standing for 72 hours.

At 35° C, the changes were more substantial. Density increased linearly over time at a rate of about 0.0002 grams/cc per day. The concentration of HEDP increased linearly from 0.053% to 0.068% in 72 hours, and the concentration of ammonium fluoride increased linearly from 0.038% to 0.045% in 72 hours. The concentration of glyoxylic acid increased from 0.41%% at time zero to 0.52% 72 hours later. Nevertheless, the pH declined from an initial value of 2.382 to 2.342 seventy-two hours later. The concentration of PGME increased from about 9.7% to about 13%, with most of this increase happening during the second day.

Finally, seventy-two hour beaker tests were also performed on sample I at room temperature (~21° C. to 25° C.) and 35° C., with properties being measured every 24 hours. Over 72 hours at 21° C. to 25° C., the density showed no significant change, the pH declined from 2.16 to about 2.158, and there were slight changes in the concentrations of ammonium fluoride and HEDP which mirrored similar changes seen for samples A and B. One significant difference was that the concentration of PGME showed a significantly greater increase than would be expected based on the results of samples A and B, in that it increased from 7.9% to 8.5% over 72 hours. The cleaning efficiency and compatibility properties of composition I would be within accepted allowances, even after an open beaker of sample I was left standing for 72 hours.

At 35° C., the changes were more substantial. Density increased linearly over time at a rate of about 0.0004 grams/cc per day. The concentration of HEDP increased linearly from 0.055% to 0.070% in 72 hours, and the concentration of ammonium fluoride increased linearly from 0.038% to 0.045% in 72 hours. The concentration of glyoxylic acid increased from 0.45%% at time zero to 0.60% 72 hours later. The pH declined from an initial value of 2.160 to 2.114 seventy-two hours later. The concentration of PGME increased from about 7.9% to about 9.7%.

On reviewing the bath-life data for samples A, B, and I, no significant variation was observed at 25° C. for any of the measured parameters out to 72 hours. Based on typical initial component tolerance data, at 25° C. the bath-life extends out to 72 hours. That is, the cleaning efficiency and compatibility properties of composition A would be within accepted allowances, even after an open beaker of samples A, B, and I was left standing for 72 hours. However, this does not reflect the full effects of evaporation and the gradual loss of volume would necessitate either a periodical top-up or a bath-life of around 48 hours.

The loss of volume at 35° C. acts to concentrate all of the active components. The concentration effect results in a decrease in pH over the duration of the test but this was not particularly significant. The activity of the fluoride species at low pH values is fairly stable over such modest concentration changes to further reduction in pH.

SEM inspection at low accelerating voltages was employed to determine the extent of cleaning and any loss of material for the Cu and TEOS substrates. A high cleaning efficiency was seen with both substrates at 25° C. and 35° C. with all polymer and etched residue readily removed in around 60 seconds. Extensive over processing to 10 minutes generally did not result in unacceptable Cu attack or loss of CD. Concurrent functional tests of cleaning and TEOS/Cu etch for samples A, B, and I, vie SEM images, were conducted during the open beaker tests, and they show complete cleaning and no significant loss of material, and there are no significant variations in this result over 48 hours at either 25 or 35° C. At 72 hours there was some increase in TEOS etch rates, but the increase is well within typical manufacturer tolerances. This will be described in Example 8-L. The primary parameter for determining bath-life appears to be water evaporation. There was little loss of PGME during the testing. Generally, it is preferred that the organic water-miscible solvents have a lower vapor pressure than water at the intended temperatures of use. PGME meets this criterion, where the intended temperature of use is preferably from 15° C. to 45°

C. Based on the open beaker tests the bath-life of these 3 formulations extends at least to 48 hours.

Example 8-L

Stability of cleaning solutions is highly desirable. To show low etch rates of TEOS and copper, and to show that neither etch rates nor etch residue removal capability fluctuate over time, open beakers of compositions A, B and I were held at 25° C. but vented to ambient conditions. At the initial time and again at 24, 48 and 72 hours three different substrates, TEOS, copper, and via structures with etch residues made from TEOS/copper substrates, were immersed in the compositions for 10 minutes. Inspection by SEM showed complete cleaning of the residues without undue damage to the substrates, such that the substrate can continue manufacturing to provide a functional integrated circuit. The etch rates were acceptably low for all tests. The copper and TEOS etch rate data is shown in Table 12.

TABLE 12

Nanometers of TEOS and Cu etched from immersed wafers in 10 minutes at 25° C.

|  | Initial | 24 hr | 48 hr | 72 hr |
|---|---|---|---|---|
| Sample/TEOS |  |  |  |  |
| A | 0.9 | 0.8 | 0.7 | 0.8 |
| B | 0.7 | 0.8 | 0.7 | 0.8 |
| I | 0.7 | 0.6 | 0.6 | 0.8 |
| Sample/Cu |  |  |  |  |
| A | 1.8 | 2.5 | 1.8 | 2.0 |
| B | 1.0 | 1.5 | 1.8 | 1.3 |
| I | 1.8 | 2.0 | 2.1 | 1.7 |

Example 8-M 300 mm wafers obtained from 90 nm node wafers with the low K dielectric MSQ were tested in both beaker and SEZ evaluations. Typically, residue were very rapidly cleaned and no copper attack was seen at the process conditions used.

For beaker tests. the wafers, having residues, were immersed in a static bath of each of compositions A and B at each of 25° C. and 35° C. for each of 60, 120 and 600 seconds. Inspection by SEM showed complete cleaning of the residues without undue damage to the substrates, such that the substrate can continue manufacturing to provide a functional integrated circuit. In particular, inspection by SEM showed complete cleaning of the residues in 60 seconds—the earliest time an observation was made. Further, extensive over-processing to 10 minutes did not result in any appreciable copper etching or loss of critical dimension. Attack of the dielectric was observed at 45° C. when processed for ten minutes, but not at less extreme conditions.

Example 8-N

Testing was also performed on a Black Diamond wafer with samples A, B, and I. The residues were readily removed by all three formulations over a broad process window −25° C. to 45° C., and cleaning times from 30 seconds to 120 seconds. It was evident that sample A was generally faster at cleaning than either the sample B and Sample I. It was also clear that while sample B and Sample I were largely equivalent at longer process times, sample I possessed a higher cleaning efficiency at shorter times that sample B. However, based on subjective evaluations of SEM data, Sample A was more efficient than Sample I in Single Wafer compatible process times.

Example 8-O

Certain manufacturers are now evaluating a different integration scheme, Trench First Via Last (TFVL) and have been experiencing formation of very heavy residues that cannot be removed with conventional fluoride formulations. We surprisingly found that removing HEDP from the formulation increases the cleaning. Sample I is an analogue of sample A but without any HEDP. Generally, for such extensive residue, full cleaning within a time frame useful for single wafer processing, e.g., about 1 minute, required a temperature of at least 45° C. However, even at extended process times, e.g., 5 minutes and 10 minutes, there was no visual CD loss or Cu attack.

Example 8-P

Testing of samples A and I were carried out on a wafer processing instrument at several different times and temperatures. Fluid flow rate was 1.5 liters per minute and the spin rate was 500 RPM. Very fast cleaning was observed, e.g., on the order of 30 s at 30° C. Good cleaning was observed with some samples, but while a series of tests using an FSG wafer showed good cleaning of the Cu surface there was less than optimum removal efficiency of sidewall residues. This was possibly a result of poor mass transport across the surface of the wafer section during chemical dispense—as small die sections were used for the testing. Overall Sample A was best suited for short process times but was aggressive when used for long batch processes, e.g., greater than 20 minutes. Sample I gave the best overall process window with acceptable results from 30s to 20 minutes, though at shorter times sample A had better performance.

The results described above demonstrate the breadth of capability of the disclosed compositions, that is, the compositions will effectively clean multiple types of residues from multiple types of substrates without damaging the substrates. Remarkably the compositions are effective not only in the length of time required for immersion bath operations, but also are effective in the shorter times utilized for spray cleaning (single wafer processing) operation. Such robust performance is highly desired.

Comparative Example 9

To show that two or more solvents may be used a series of four compositions was prepared holding constant the fluorine-containing component, acid and water concentrations. The water concentration was about 55%. The solvent fraction of the compositions contained diethylene glycol butyl ether (DGBE) and dimethylsulfoxide (DMSO), and the glycol: DMSO ratios were 2:3, 1:1, 3:2 and 3:1. Copper etch rate, TEOS etch rate, copper oxide removal and etch residue removal were tested at each ratio, and were generally excellent.

Example 10

To show that higher concentrations of organic acid (or at least salts thereof) may be used a composition consisting of 0.04% ammonium fluoride; 1% PGME; 88.8% water; 0.06% of the chelator HEDP (1-hydroxyethylidene-1,1-diphosphonic acid) and about 0.004% phosphonic or phosphorous acid (the chelator and phosphonic or phosphorous acid provided by adding 0.1% DEQUEST 2010™); and 10% of diammonium citrate was prepared and tested. The composition had a pH of between about 4.5 and 5.5, typically about 4.9. The composition had low copper and TEOS etch rates of 4.3 and 0.24 total nm etched at room temperature over 30 minutes, and a quick copper oxide removal time of 21 seconds, and it removed polymer residue. The composition completely removed polymer residue from a copper/FSG substrate. Surprisingly, however, some electrochemical corrosion of copper was observed. This example also shows that salts of organic acids may be useful.

Example 11

To show that even higher pH values are useful in the compositions of the invention a composition consisting of 0.04% ammonium fluoride; 7.5% PGME; 86.7% water; 0.06% of the chelator HEDP (1-hydroxyethylidene-1,1-diphosphonic acid) and about 0.004% phosphonic or phosphorous acid (the chelator and phosphonic or phosphorous acid provided by adding 0.1% DEQUEST 2010™); 3% of 2-dimethylaminoethanol; and 2.7% citric acid was prepared and tested. The composition had a pH of about 5.5-6, typically 5.7. The composition had low copper and TEOS etch rates of 3.0 and 0.1 total nm etched at room temperature over 30 minutes, and a quick copper oxide removal time of 21 seconds. The composition completely removed polymer residue from a copper/FSG substrate. Further, no electrochemical corrosion of copper was observed.

Example 12

To show that copper oxide removal rate time and copper etch rate are strongly affected by pH the composition of Example 11 was modified by substituting diethylenetriamine pentaacetic acid for the chelator DEQUEST 2010, and by substituing 2-diethylaminoethanol for the 2-dimethylaminoethanol to provide a composition with a pH of about 6.1 to 6.5, typically about 6.3. The amount of copper etch increased 143% to an unacceptable 7.6 nm and the copper oxide removal time increased 114% to an unacceptable time of 45 seconds. Still, the composition completely removed polymer residue from a copper/FSG substrate.

Certain embodiments of this invention, as well as certain advantages of this invention, are illustrated by the preceding non-limiting examples. Although only a limited number of examples are disclosed herein, in the interests of brevity and clarity, it will be apparent to those skilled in the art that many modifications, both to materials and methods, may be practiced without departing from the purpose and interest of this invention.

What is claimed is:

1. A method for removing one or more of resist, etching residue, planarization residue, and copper oxide from a substrate comprising copper and a low-k dielectric material, said method comprising the steps of:
   A) providing a substrate having a surface comprising copper-containing conductor and a low-k dielectric material and one or more of resist, etching residue, planarization residue, and copper oxide disposed on the surface thereof;
   B) contacting the surface of the substrate with a composition comprising:
      a) from 0.01% by weight up to 0.12% by weight of a fluoride-providing component selected from HF, $NH_4F$, or a mixture thereof;
      b) from 1.5% by weight up to 6.0% by weight of a water miscible organic solvent which is a glycol ether;
      c) from 0.75% by weight up to 1.25% by weight of an organic acid having from 1 to 3 carbon atoms;
      d) from 85% by weight up to 98% by weight water, and
      e) optionally from 0% by weight up to 0.15% by weight of a chelator wherein the pH of the composition is less than 3, for a time and at a temperature sufficient to remove the resist, residues, and/or copper oxide.

2. The method of claim 1, wherein the composition is substantially free of mineral acids and the temperature is between about 20° C. to about 70° C.

3. The method of claim 1, wherein the glycol ether comprises propylene glycol monoethyl ether, propylene glycol monomethyl ether, diethylene glycol monomethyl ether, diethylene glycol monobutyl ether, or a mixture thereof.

4. The method of claim 1, wherein the organic acid consists essentially of one or more carboxylic acids.

5. The method of claim 4, wherein the carboxylic acid comprises an hydroxy substituted carboxylic acid, a carbonyl substituted carboxylic acid, or a mixture thereof.

6. The method of claim 5, wherein the carboxylic acid is glycolic acid and glyoxylic acid.

7. The method of claim 1, wherein the composition comprises from about 0.05% by weight to about 1% by weight of a chelator selected from a group of organo-phosphonate compounds having a plurality of phosphonate moieties, or mixtures thereof.

8. The method of claim 7, wherein the chelator comprises organo-phosphonate compounds which are phosphonic acids.

9. The method of claim 8, wherein the phosphonic acid is 1-hydroxyethylidene-1,1 diphosphonic acid.

10. The method of claim 1 wherein the time is between about 20 seconds and about 10 minutes, and the temperature is from 15° C. up to 50° C.

11. A method for removing one or more of resist, etching residue, planarization residue, and copper oxide from a substrate comprising copper and a low-k dielectric material, said method comprising the steps of:
   A) providing a substrate having a surface comprising copper-containing conductor and a low-k dielectric material and one or more of resist, etching residue, planarization residue, and copper oxide disposed on the surface thereof;
   B) contacting the surface of the substrate with a composition comprising:
      a. from 0.01% by weight up to 0.12% by weight of ammonium fluoride;
      b. from 1.5% by weight up to 3.5% by weight of propylene glycol monomethyl ether (PGME);
      c. from 0.75% by weight up to 1.25% by weight of glyoxylic acid;
      d. from 85% by weight up to 98% by weight water, and
      e. from 0.5% by weight up to 1.0% by weight of 1-hydroxyethylidene-1,1 diphosphonic acid,
wherein the pH of the composition is less than 3 for a time and at a temperature sufficient to remove the resist, residues, and/or copper oxide.

* * * * *